(12) United States Patent
Chang et al.

(10) Patent No.: US 8,802,227 B2
(45) Date of Patent: Aug. 12, 2014

(54) COATED ARTICLE AND METHOD FOR MAKING SAME

(75) Inventors: Hsin-Pei Chang, New Taipei (TW); Huann-Wu Chiang, New Taipei (TW); Cheng-Shi Chen, New Taipei (TW); Cong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 247 days.

(21) Appl. No.: 13/238,170

(22) Filed: Sep. 21, 2011

(65) Prior Publication Data

US 2013/0029096 A1    Jan. 31, 2013

(30) Foreign Application Priority Data

Jul. 29, 2011 (CN) .......................... 2011 1 0215438

(51) Int. Cl.
   *B32B 9/00*    (2006.01)

(52) U.S. Cl.
   USPC ........... 428/336; 428/216; 428/469; 428/472; 428/698

(58) Field of Classification Search
   USPC .......................... 428/216, 336, 469, 472, 698
   See application file for complete search history.

(56) References Cited

U.S. PATENT DOCUMENTS

| | | | | | |
|---|---|---|---|---|---|
| 4,763,601 | A | * | 8/1988 | Saida et al. ................... | 118/718 |
| 5,079,089 | A | * | 1/1992 | Ito et al. ......................... | 428/336 |
| 5,427,843 | A | * | 6/1995 | Miyajima et al. ............. | 428/469 |
| 2002/0192473 | A1 | * | 12/2002 | Gentilhomme et al. ...... | 428/216 |
| 2007/0275264 | A1 | * | 11/2007 | Hultin et al. .................. | 428/687 |
| 2008/0038579 | A1 | * | 2/2008 | Schuisky et al. ............. | 428/640 |
| 2009/0181262 | A1 | * | 7/2009 | Isaksson et al. .............. | 428/626 |

FOREIGN PATENT DOCUMENTS

JP        02-122064        *  5/1990

* cited by examiner

*Primary Examiner* — Archene Turner
(74) *Attorney, Agent, or Firm* — Novak Druce Connolly Bove + Quigg LLP

(57) ABSTRACT

A coated article includes a substrate, a first ceramic layer deposited on the substrate, a color layer deposited on the first ceramic layer, and a second ceramic layer deposited on the color layer. The first ceramic layer substantially includes substance M, elemental O and elemental N, wherein M is Al or Si. The color layer substantially includes metal M', O and elemental N, wherein M' is elemental Al or Zn. The second ceramic layer substantially includes substance M, elemental O and elemental N, wherein M is Al or Si.

20 Claims, 2 Drawing Sheets

COATED ARTICLE AND METHOD FOR MAKING SAME

CROSS-REFERENCE TO RELATED APPLICATIONS

This application is one of the six related co-pending U.S. patent applications listed below. All listed applications have the same assignee. The disclosure of each of the listed applications is incorporated by reference into the other listed applications.

| Attorney Docket No. | Title | Inventors |
|---|---|---|
| 13/238,157 | COATED ARTICLE AND METHOD FOR MAKING SAME | HUANN-WU CHIANG et al. |
| 13/238,160 | COATED ARTICLE AND METHOD FOR MAKING SAME | HUANN-WU CHIANG et al. |
| 13/238,164 | COATED ARTICLE AND METHOD FOR MAKING SAME | HSIN-PEI CHANG et al. |
| 13/238,169 | COATED ARTICLE AND METHOD FOR MAKING SAME | WEN-RONG CHEN et al. |
| 13/238,170 | COATED ARTICLE AND METHOD FOR MAKING SAME | HSIN-PEI CHANG et al. |
| 13/238,176 | COATED ARTICLE AND METHOD FOR MAKING SAME | WEN-RONG CHEN et al. |

BACKGROUND

1. Technical Field

The exemplary disclosure generally relates to coated articles and a method for manufacturing the coated articles, particularly coated articles having a bone china-like appearance and a method for making the coated articles.

2. Description of Related Art

Spraying can be used to deposit a white layer on housings of portable electronic devices to give the housings a white ceramic-like appearance. However, the layers formed by spraying cannot present with a high level of whiteness, brightness, and translucent appearance like a bone china. Additionally, the layers formed by spraying have low abrasion and low scratch resistance.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
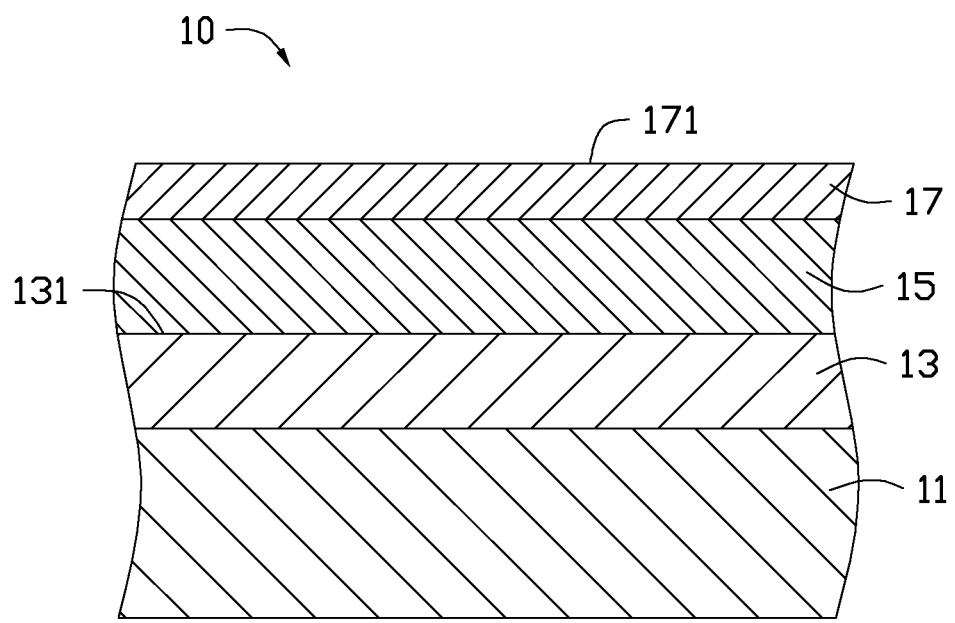
FIG. 1 is a cross-sectional view of an exemplary embodiment of coated article.

FIG. 1 shows an exemplary embodiment of a coated article. The coated article 10 includes a substrate 11, a first ceramic layer 13 formed on the substrate 11, a color layer 15 formed on the first ceramic layer 13 and a second ceramic layer 17 formed on the color layer 15. The coated article 10 may be a housing of a mobile phone, personal digital apparatus (PDA), notebook computer, portable music player, GPS navigator, or digital camera.

The substrate 11 may be made of metal, such as stainless steel, aluminum, aluminum alloy, magnesium and magnesium alloy. The substrate 11 may also be made of nonmetal material, such as plastic.

The ceramic layer 13 substantially includes substance M, elemental oxygen (O) and elemental nitrogen (N), wherein M can be a metal or non-metal, such as elemental aluminum (Al) or elemental silicon (Si). When M is Al, the mass percentage of elemental Al is about 60%-70%, the mass percentage of O is about 17%-22% and the mass percentage of elemental N is about 2%-15%. When M is Si, the mass percentage of elemental Si is about 65%-75%, the mass percentage of O is about 17%-22% and the mass percentage of elemental N is about 3%-18%.

The color layer 15 may be deposited by physical vapor deposition methods such as magnetron sputtering, vacuum evaporation or arc ion plating. The color layer 15 substantially includes substance M', O and elemental N, wherein the M' is a metal, such as aluminum (Al) or zinc (Zn). When the M' is Al, the mass percentage of elemental Al is about 90%-95%, the mass percentage of O is about 2%-4% and the mass percentage of elemental N is about 1%-8%. When the M' is Zn, the mass percentage of elemental Zn is about 60%-72%, the mass percentage of elemental O is about 18%-25% and the mass percentage of elemental N is about 3%-22%.

The color layer 15 has an $L^*$ value between about 89 to about 93, an $a^*$ value between about −0.5 to about 0.5, and a $b^*$ value between about −0.5 to about 0.5 in the CIE $L^*a^*b^*$ (CIE LAB) color space, so the color layer 15 is white.

The second ceramic layer 17 substantially includes substance M, elemental oxygen (O) and elemental nitrogen (N), wherein M can be a metal or non-metal, such as elemental aluminum (Al) or elemental silicon (Si). When M is Al, the mass percentage of elemental Al is about 60%-70%, the mass percentage of elemental O is about 25%-28% and the mass percentage of elemental N is about 2%-15%. When M is Si, the mass percentage of Si is about 65%-75%, the mass percentage of elemental O is about 17%-22% and the mass percentage of elemental N is about 3%-18%. The average particle diameter of the second outer surface 171 is about 10 nm to about 15 nm. The second ceramic layer 17 has a second outer surface 171 away from the color layer 15. The surface roughness (Ra) of the second outer surface 171 is about 10 nm to about 40 nm.

The first ceramic layer 13 and the second layer 17 are transparent and colorless. The first ceramic layer 13 and the second layer 17 are deposited by magnetron sputtering, vacuum evaporation or arc ion plating. The first ceramic layer 13 has a thickness of about 1 μm to about 2 μm. The second ceramic layer 17 has a thickness of about 1.5 μm to about 2 μm.

The first ceramic layer 13, the color layer 15 combined with the second layer 17 causes the coated article 10 to present a high level of whiteness, brightness and translucent appearance like bone china. The 60 degree specula gloss (Gs 60°) of the second layer 17 is about 101-108. The coated article 10 has an $L^*$ value between about 89 to about 93, an $a^*$ value between about −0.5 to about 0.5, and a $b^*$ value between about −0.5 to about 0.5 in the CIE $L^*a^*b^*$ (CIE LAB) color space.

A method for manufacturing the coated article 10 may include at least the following steps:

Providing a substrate 11. The substrate 11 may be made of metal, such as stainless steel, aluminum, aluminum alloy, magnesium and magnesium alloy. The substrate 11 may also be made of non-metal material, such as plastic.

Pretreating the substrate 11 by washing with a solution (e.g., alcohol or acetone) in an ultrasonic cleaner to remove impurities and contaminations, such as grease, or dirt. The substrate 11 is then dried.

Figure 2:
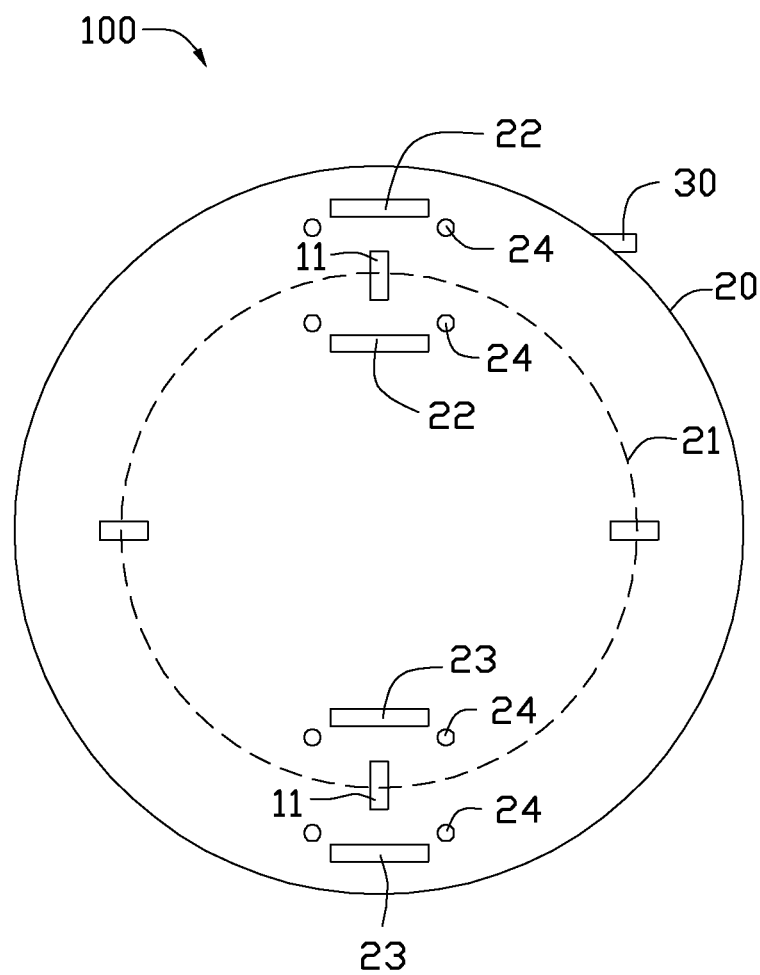
FIG. 2 is a schematic view of a vacuum sputtering coating machine for manufacturing the coated article of FIG. 1.

The substrate 11 is then cleaned by argon plasma cleaning. Providing a vacuum sputtering coating machine 100. Referring to FIG. 2, the vacuum sputtering coating machine 100 includes a sputtering coating chamber 20 and a vacuum pump 30 connected to the sputtering coating chamber 20. The vacuum pump 30 is used to evacuate the sputtering coating chamber 20. The vacuum sputtering coating machine 100 further includes a rotating bracket 21, two first targets 22, two second targets 23, and a plurality of gas inlets 24. The rotating bracket 21 rotates the substrate 11 in the sputtering coating chamber 20 relative to the first targets 22 and the second targets 23. The two first targets 22 face to each other, and are located on opposite sides of the rotating bracket 21, and the same arrangement apply to the two second targets 23. In the exemplary embodiment, the first targets 22 are made of Al, Al alloy, Si, or Si alloy, the second targets 23 are made of Al, Al alloy, Zn, or Zn alloy. When the first targets 22 are made of Al alloy, the mass percentage of the elemental Al is about 90%-95%; when the first targets 22 are made of Si alloy, the mass percentage of the elemental Si is about 75%-88%. When the second targets 23 are made of Al alloy, the mass percentage of the elemental Al is about 89%-95%; when the second targets 23 are made of Zn alloy, the mass percentage of the Zn is about 87%-92%.

Cleaning the substrate 11 by argon (Ar) plasma. The substrate 11 is retained on a rotating bracket 21 in a sputtering coating chamber 20. The vacuum level inside the sputtering coating chamber 20 is set to about $8.0 \times 10^{-3}$ Pa. Argon gas is fed into the sputtering coating chamber 20 at a flux rate about 100 Standard Cubic Centimeters per Minute (sccm) to about 400 sccm from the gas inlets 24. A bias voltage applied to the substrate 11 may be between about −200 volts (V) and about −500 V. The argon particles strike against and clean the surface. Plasma cleaning the substrate 11 may take from about 3 min to about 20 min.

A first ceramic layer 13 is deposited on the substrate 11. The temperature in the sputtering coating chamber 20 is set between about 20° C. (Celsius degree) and about 200° C. Argon may be used as a working gas and is injected into the sputtering coating chamber 20 at a flow rate from about 100 sccm to about 300 sccm. Nitrogen ($N_2$) and oxygen ($O_2$) may be used as reaction gases. The nitrogen may have a flow rate of about 80 sccm to about 200 sccm, the oxygen may have a flow rate of about 80 sccm to about 200 sccm. The first targets 22 in the sputtering coating chamber 20 are evaporated at a power between about 5 kW and about 10 kW. A bias voltage applied to the substrate 11 may be between about −100 V and about −300 V, for between about 25 minutes and about 30 minutes, to deposit the first ceramic layer 13 on the substrate 11. The first ceramic layer 13 has a thickness of about 1 μm to about 2 μm. The first ceramic layer 13 has a first outer surface 131 away from the substrate 11.

Polishing the first outer surface 131 to improve the glossiness of the first ceramic layer 15 and subsequent layers that will be formed on the first ceramic layer 15. Providing a finishing and polishing machine (not shown). The finishing and polishing machine includes a canvas polishing wheel. Polishing fluid is coated on the outer surface of the canvas polishing wheel to polish the first outer surface 131 for about 10 min to about 15 min. The polishing fluid is a suspension, which substantially comprises alumina powder and water.

Depositing the color layer 15 on the first ceramic layer 13. The internal temperature of the sputtering coating chamber 20 is maintained at about 20° C. to about 200° C. Argon may be used as a working gas and is injected into the sputtering coating chamber 20 at a flow rate from about 100 sccm to about 300 sccm. Nitrogen ($N_2$) and oxygen ($O_2$) may be used as reaction gases. The nitrogen may have a flow rate of about 20 sccm to about 40 sccm, the oxygen may have a flow rate of about 30 sccm to about 50 sccm. The second targets 23 in the sputtering coating chamber 20 are evaporated at a power between about 5 kW to about 10 kW. The substrate 11 may have a negative bias voltage about −100 V to about −300 V to deposit the color layer 15 on the first ceramic layer 13. Depositing of the color layer 15 may take from about 10 min to about 30 min.

A second ceramic layer 17 is deposited on the color layer 15. The temperature in the sputtering coating chamber 20 is set between about 20° C. (Celsius degree) and about 200° C. Argon may be used as a working gas and is injected into the sputtering coating chamber 20 at a flow rate from about 100 sccm to about 300 sccm. Nitrogen ($N_2$) and oxygen ($O_2$) may be used as reaction gases. The nitrogen may have a flow rate of about 80 sccm to about 200 sccm, the oxygen may have a flow rate of about 80 sccm to about 200 sccm. The first targets 22 in the sputtering coating chamber 20 are evaporated at a power between about 5 kW and about 10 kW. A bias voltage applied to the substrate 11 may be between about −100 V and about −300 V, for between about 30 minutes and about 45 minutes, to deposit the second ceramic layer 17 on the color layer 15. The second ceramic layer 17 has a thickness of about 1.5 μm to about 2 μm.

Polishing the second outer surface 171 to increase the glossiness and the transparency of the second ceramic layer 17. Providing a finishing and polishing machine (not shown). The finishing and polishing machine includes a canvas polishing wheel. Polishing fluid is coated on the outer surface of the canvas polishing wheel to polish the second outer surface 171 for about 10 min to about 15 min. The polishing fluid is a suspension, which substantially comprises alumina powder and water. The 60 degree specula gloss (Gs 60°) of the second outer surface 171 is about 101-108 after the polishing process.

It is to be understood that the first ceramic layer 13, the color layer 15 and the second ceramic layer 17 may instead be deposited by vacuum evaporation or arc ion plating.

Because the first ceramic layer 13 and the second ceramic layer 17 deposited by physical vapor deposition have a high gloss and transparency, and the color layer 15 formed between the first ceramic layer 13 and the second ceramic layer 17 is white, the coated article 10 may present a high level of whiteness and translucent appearance like a bone china Furthermore, polishing the first ceramic layer 13 can improve the glossiness of the first ceramic layer 15 and the subsequent layers formed on the first ceramic layer 15. Polishing the second outer surface 171 can improve the glossiness and the transparency of the second ceramic layer 17. So the first ceramic layer 13, the color layer 15 combined with the second ceramic layer 17 causes the coated article 10 to present a high level of whiteness and brightness, and translucent appearance like a bone china.

Additionally, the first ceramic layer 13, the color layer 15, and the second ceramic layer 17 have a high hardness. The layers formed on the substrate 11 have a high bonding force. Thus, the coated article 10 has a high abrasion and scratch resistance.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
   a substrate;
   a first ceramic layer deposited on the substrate, the first ceramic layer consisting essentially of substance M, elemental O and elemental N, wherein M is Al or Si;
   a color layer deposited on the first ceramic layer, the color layer consisting essentially of metal M', elemental O and elemental N, wherein M' is Al or Zn; and
   a second ceramic layer deposited on the color layer, the second ceramic layer consisting essentially of the same substance M as in the first ceramic layer, elemental O and elemental N.

2. The coated article as claimed in claim 1, wherein when M is Al in the first ceramic layer, the mass percentage of elemental Al is about 60%-70%, the mass percentage of elemental O is about 25%-28% and the mass percentage of elemental N is about 2%-15%.

3. The coated article as claimed in claim 1, wherein when M is Si in the first ceramic layer, the mass percentage of elemental Si is about 65%-75%, the mass percentage of elemental O is about 17%-22% and the mass percentage of elemental N is about 3%-18%.

4. The coated article as claimed in claim 1, wherein when the M' is elemental Al in the color layer, the mass percentage of elemental Al is about 90%-95%, the mass percentage of elemental O is about 2%-4% and the mass percentage of elemental N is about 1%-8%.

5. The coated article as claimed in claim 1, wherein the M' is Zn in the color layer, the mass percentage of elemental Si is about 60%-72%, the mass percentage of elemental O is about 18%-25% and the mass percentage of elemental N is about 3%-22%.

6. The coated article as claimed in claim 1, wherein the color layer has an L* value between about 89 to about 93, an a* value between about −0.5 to about 0.5, and a b* value between about −0.5 to about 0.5 in the CIE L*a*b* color space.

7. The coated article as claimed in claim 1, wherein the second ceramic layer comprises a second outer surface away from the color layer, the average particle diameter of the second outer surface is about 10 nm to about 15 nm.

8. The coated article as claimed in claim 1, wherein the second ceramic layer comprises a second outer surface away from the color layer, the surface roughness (Ra) of the second outer surface of the second ceramic layer is about 10 nm to about 40 nm.

9. The coated article as claimed in claim 1, wherein the first ceramic layer has a thickness of about 1 μm to about 2 μm.

10. The coated article as claimed in claim 1, wherein the second ceramic layer has a thickness of about 1.5 μm to about 2 μm.

11. The coated article as claimed in claim 1, wherein the 60 degree specula gloss of the second layer is about 101-108.

12. The coated article as claimed in claim 1, wherein the coated article has an L* value between about 89 to about 93, an a* value between about −0.5 to about 0.5, and a b* value between about −0.5 to about 0.5 in the CIE L*a*b* color space.

13. The coated article as claimed in claim 1, wherein the first ceramic layer and the second layer are transparent and colorless.

14. A method for manufacturing an article comprising:
   providing a substrate;
   depositing a first ceramic layer, the first ceramic layer having a first outer surface away from the substrate, the first ceramic layer substantially including substance M, elemental O and elemental N, wherein the M is Al or Si, during deposition of the first ceramic layer, $N_2$ and $O_2$ used as reaction gases, the first targets are made of Al, Al alloy, Si or Si alloy;
   polishing the first outer surface;
   depositing a color layer on the first ceramic layer, the color layer consisting essentially of substance M', elemental O and elemental N, wherein the M' is elemental Al or Zn, during deposition of the first ceramic layer, $N_2$ and $O_2$ used as reaction gases, the second targets are made of Al, Al alloy, Zn or Zn alloy;
   depositing a second ceramic layer on the color layer, the second ceramic layer having a first outer surface away from the color layer, the second ceramic layer consisting essentially of substance M, elemental O and elemental N, wherein the M is Al or Si, during deposition of the second ceramic layer, $N_2$ and $O_2$ used as reaction gases, the first targets are made of Al, Al alloy, Si or Si alloy;
   polishing the second outer surface.

15. The method of claim 14, wherein when the first targets are made of Al alloy, the mass percent of the elemental Al is about 90%-95%, when the first targets are made of Si alloy, the mass percent of the elemental Si is about 75%-88%.

16. The method of claim 14, wherein during deposition of the first ceramic layer on the substrate, the substrate is retained in a sputtering coating chamber of a vacuum sputtering coating machine; the temperature in the sputtering coating chamber is set between about 20° C. and about 200° C.; argon is fed into the sputtering coating chamber at a flux between about 100 sccm and about 300 sccm, nitrogen is fed into the sputtering coating chamber at a flux between about 80 sccm and 200 sccm and oxygen is fed into the sputtering coating chamber at a flux between about 80 sccm and 200 sccm; the first targets in the sputtering coating chamber are evaporated at a power between about 5 kW and about 10 kW; a bias voltage applied to the substrate is between about −100 volts and about −300 volts for between about 25 minutes and about 30 minutes, to deposit the first ceramic layer on the substrate.

17. The method of claim 14, wherein when the second targets are made of Al alloy, the mass percent of the elemental Al is about 89%-95%; when the second targets are made of Zn alloy, the mass percent of the Zn is about 87%-92%.

18. The method of claim 14, wherein during deposition of the color layer on the first ceramic layer, the substrate is retained in a sputtering coating chamber of a vacuum sputtering coating machine; the temperature in the sputtering coating chamber is set between about 20° C. and about 200° C.; argon is fed into the sputtering coating chamber at a flux between about 100 sccm and about 300 sccm, nitrogen is fed into the sputtering coating chamber at a flux between about 20 sccm and 40 sccm and oxygen is fed into the sputtering coating chamber at a flux between about 30 sccm and 50 sccm; the second targets in the sputtering coating chamber are evaporated at a power between about 5 kW and about 10 kW; a bias voltage applied to the substrate is between about −100

V and about −300 V for between about 10 minutes and about 30 minutes, to deposit the color layer on the first ceramic layer.

19. The method of claim 14, wherein during deposition of the second ceramic layer on the color layer, the color layer is retained in a sputtering coating chamber of a vacuum sputtering coating machine; the temperature in the sputtering coating chamber is set between about 20° C. and about 200° C.; argon is fed into the sputtering coating chamber at a flux between about 100 sccm and about 300 sccm, nitrogen is fed into the sputtering coating chamber at a flux between about 80 sccm and 200 sccm and oxygen is fed into the sputtering coating chamber at a flux between about 80 sccm and 200 sccm; the first targets in the sputtering coating chamber are evaporated at a power between about 5 kW and about 10 kW; a bias voltage applied to the color layer is between about −100 volts and about −300 V for between about 30 minutes and about 45 minutes, to deposit the second ceramic layer on the color layer.

20. The method of claim 14, wherein during polishing the first outer surface or the second outer surface, the first outer surface or the second outer surface being polished by a canvas polishing wheel with polishing fluid for 10 min to about 15 min, the polishing fluid is a suspension which substantially comprises alumina powder and water.

\* \* \* \* \*